(12) United States Patent
He et al.

(10) Patent No.: US 8,144,541 B2
(45) Date of Patent: Mar. 27, 2012

(54) METHOD AND APPARATUS FOR ADJUSTING AND OBTAINING A REFERENCE VOLTAGE

(75) Inventors: Zaisheng He, Zhuhai (CN); Moutao Li, Zhuhai (CN); Lirong Xiao, Zhuhai (CN)

(73) Assignee: Actions Semiconductor Co., Ltd., Zhuhai (CN)

( * ) Notice: Subject to any disclaimer, the term of this patent is extended or adjusted under 35 U.S.C. 154(b) by 287 days.

(21) Appl. No.: 12/666,771

(22) PCT Filed: May 25, 2009

(86) PCT No.: PCT/CN2009/071959
§ 371 (c)(1),
(2), (4) Date: Dec. 24, 2009

(87) PCT Pub. No.: WO2009/143760
PCT Pub. Date: Dec. 3, 2009

(65) Prior Publication Data
US 2010/0188881 A1    Jul. 29, 2010

(30) Foreign Application Priority Data
May 28, 2008    (CN) .......................... 2008 1 0098275

(51) Int. Cl.
*G11C 8/00* (2006.01)
(52) U.S. Cl. ................ 365/230.06; 365/210; 365/189.07
(58) Field of Classification Search ............. 365/230.06, 365/210, 189.07
See application file for complete search history.

(56) References Cited

U.S. PATENT DOCUMENTS

| | | | |
|---|---|---|---|
| 6,472,897 B1 | 10/2002 | Shyr et al. | |
| 6,738,298 B1* | 5/2004 | Cioaca et al. | 365/189.09 |
| 7,205,758 B1 | 4/2007 | Masleid et al. | |
| 2006/0179378 A1 | 8/2006 | Iida et al. | |
| 2007/0085558 A1 | 4/2007 | Rahim et al. | |
| 2007/0203661 A1 | 8/2007 | John et al. | |

FOREIGN PATENT DOCUMENTS

| | | |
|---|---|---|
| CN | 1349251 A | 5/2002 |
| CN | 101285848 A | 10/2008 |
| JP | 9230946 A | 9/1997 |

* cited by examiner

*Primary Examiner* — Son Dinh
*Assistant Examiner* — Nam Nguyen
(74) *Attorney, Agent, or Firm* — Baker & Hostetler LLP

(57) ABSTRACT

A method for adjusting a reference voltage is provided, including: decoding a default code configured in a reference voltage register in a chip to obtain an actual reference voltage; comparing the actual reference voltage with a benchmark value to obtain a deviation value between the two; configuring an adjustment code according to the deviation value; and, burning the adjustment code into a nonvolatile storage medium. The present invention also discloses an apparatus for adjusting a reference voltage. Thus, adjustment on the reference voltage of the chip is standardized and costs of the chip's application schemes are saved. A method and apparatus for obtaining a reference voltage are also provided, and thus stability of the circuit's working is improved and costs of the chip's applications are decreased.

17 Claims, 2 Drawing Sheets

METHOD AND APPARATUS FOR ADJUSTING AND OBTAINING A REFERENCE VOLTAGE

CROSS-REFERENCE TO RELATED APPLICATIONS

This application is a Continuation of International patent application PCT/CN2009/071959, filed on May 25, 2009, which claims priority to foreign patent application CN 200810098275.8, filed on May 28, 2008.

FIELD OF THE INVENTION

The present invention relates to integrated circuit designing and test technologies, and more particularly, to a method and apparatus for adjusting and obtaining a reference voltage.

BACKGROUND OF THE INVENTION

Currently, computer and micro-electronics technology is developing quite fast, Integrated Circuit (IC) technology, as a foundation and core of Information Technology field, becomes more and more important. Multipurpose digital IC chips (called chips for short hereinafter) are widely applied to various aspects of industry production, traffic transportation and daily life.

According to the digital IC's working principle, a chip in working requires not only a working voltage but also a reference voltage provided by the external. Generally, while designing the chip, it is necessary to determine a benchmark value of the reference voltage so as to determine logic levels of various electrical levels in the circuit when the chip is actually working. Therefore, the reference voltage is a necessary condition to guarantee the digital chip's normal working, where, the chip can work according to designed functional requirements if the practical reference voltage is identical to the benchmark value, and however, if the reference voltage provided in the practical circuit deviates from the benchmark value, functions of the chip may be affected. Furthermore, once the reference voltage provided in the practical circuit deviates from the benchmark value by a value beyond a certain range, it even makes the chip completely unable to realize the designed functions, which thereby results in function invalidation or damage. Therefore, no matter with respect to chip development or to its application, the chief requirement to guarantee normal realization of the chip's functions is that the reference voltage provided for the chip in the practical circuit shall be identical to the benchmark value.

In the prior art, the reference voltage is provided for the chip in an external mode generally, i.e., an external power supply is used as the reference voltage provided for the chip. FIG. 1 is a schematic diagram illustrating a connection to an external power supply through a pin of chip. As shown in FIG. 1, a voltage signal (e.g., an output voltage of a regulated power supply with constant voltages) generated by an external reference voltage generating circuit 101 is connected to a reference voltage pin 102 of the chip, and then is further introduced by the reference voltage pin 102 into a chip functional circuit 103 so that a reference voltage is provided.

When the external mode is adopted, the reference voltage generating circuit 101 is a complete and independent functional circuit. Therefore, for the chip's applications, providing the reference voltage in the external mode means that two separate functional circuits are needed to cooperate with each other so as to ensure the chip's normal working. As is well-known, in the IC field, if integration degree of components is higher, stability of the IC will be better and costs will be lower. And thus, when the reference voltage is provided for the chip in the external mode, the stability is worse and the costs are higher.

In addition, in practical applications, the reference voltage provided by the reference voltage generating circuit 101 usually needs adjustment. In the external mode, the reference voltage generating circuit 101 can be realized in various manners. When an external power supply needs to be adjusted because the actual reference voltage output by the external power supply is different from the benchmark value, different adjusting modes for the reference voltage are required respectively regarding reference voltage generating circuits 101 realized in different manners, which undoubtedly makes the adjustment to the reference voltage more complicated and is disadvantageous for the chip's applications in various circuit application schemes.

SUMMARY OF THE INVENTION

An embodiment of the present invention provides a method for adjusting a reference voltage in a chip that includes:

decoding a default code configured in a reference voltage register in the chip to obtain an actual reference voltage;

comparing the actual reference voltage with a benchmark value to obtain a deviation value between the two;

configuring an adjustment code according to the deviation value; and, burning the adjustment code into a nonvolatile storage medium.

An embodiment of the present invention provides an apparatus for adjusting a reference voltage in a chip that includes: an actual voltage obtaining module, a deviation comparison module, an adjustment code generating and burning module and a nonvolatile storage medium, where:

the actual voltage obtaining module is adapted to decode a default code configured in a reference voltage register in the chip to obtain an actual reference voltage;

the deviation comparison module is adapted to compare the actual reference voltage with a benchmark value to obtain a deviation value between the two;

the adjustment code generating and burning module is adapted to configure an adjustment code according to the deviation value and burn the adjustment code into a nonvolatile storage medium; and, the nonvolatile storage medium, adapted to store the adjustment code written by the adjustment code generating and burning module.

An embodiment of the present invention provides an apparatus for obtaining a reference voltage in a chip that includes: a nonvolatile storage medium module, the apparatus being adapted to decode a default code configured in a reference voltage register in the chip to obtain an actual reference voltage, compare the actual reference voltage with a benchmark value to obtain a deviation value between the two, configure an adjustment code according to the deviation value and burn the adjustment code into the nonvolatile storage medium module; and, the apparatus further includes a decoding and outputting module;

the nonvolatile storage medium module adapted to send the adjustment code when the chip is started; and, the decoding and outputting module being adapted to decode the adjustment code sent by the nonvolatile storage medium module to obtain an actual reference voltage, and output the obtained actual reference voltage.

An embodiment of the present invention provides a method for obtaining a reference voltage in a chip that includes:

decoding a default code configured in a reference voltage register in the chip to obtain an actual reference voltage, comparing the actual reference voltage with a benchmark value to obtain a deviation value between the two, configuring an adjustment code according to the deviation value and burning the adjustment code into a nonvolatile storage medium module; and, the method further includes:

reading out the adjustment code burnt into the nonvolatile storage medium module when the chip is started; and, decoding the adjustment code to obtain an actual reference voltage.

DETAILED DESCRIPTION

The present invention will be described in detail with reference to embodiments and the accompanying drawings to make objective, technical schemes and merits thereof clearer.

Figure 1:
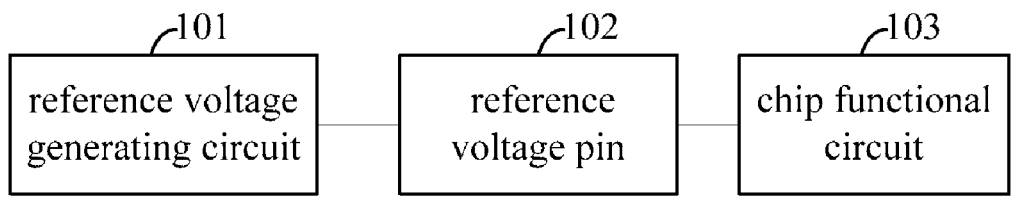
FIG. 1 is a schematic diagram illustrating providing a reference voltage for a chip in an external mode in the prior art.
Figure 2:
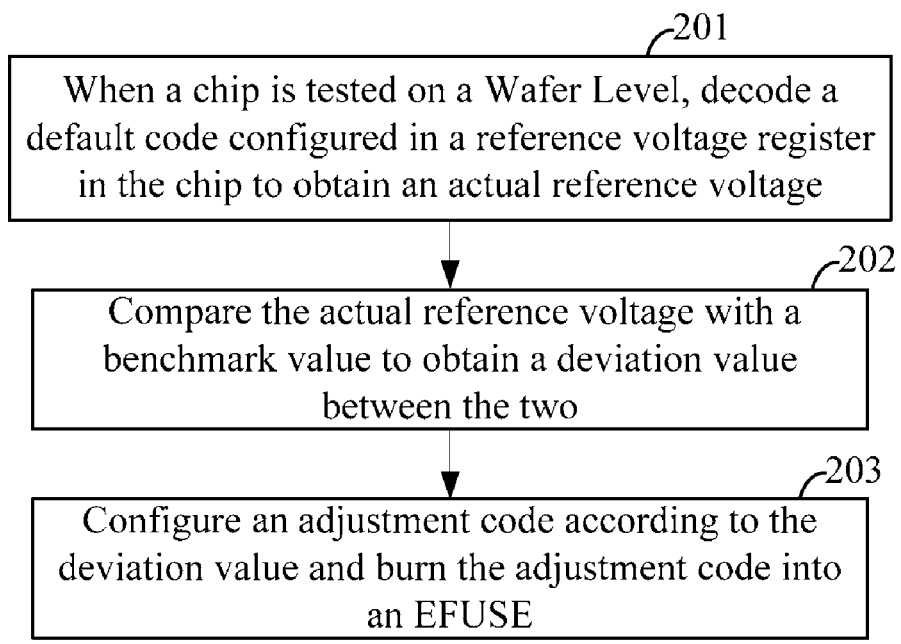
FIG. 2 is a schematic diagram illustrating a method for adjusting a reference voltage according to an embodiment of the present invention.

An embodiment of the present invention provides a method for adjusting a reference voltage. As shown in FIG. 2, the method includes:

Step 201: When a chip is tested on a Wafer Level, a default code configured in a reference voltage register in the chip is decoded so that an actual reference voltage is obtained.

Step 202: A deviation value between the actual reference voltage and a benchmark value is obtained by comparing the actual reference voltage with the benchmark value.

Step 203: An adjustment code is configured according to the deviation value and is burnt into Electrically programmable FUSE (EFUSE).

It should be noted that, if the chip's manufacture process is precise enough, the actual reference voltage obtained in Step 201 does not deviate from the benchmark value. In other words, a code corresponding to the benchmark value is pre-configured in the reference voltage register of the chip, and when the chip is working, the code corresponding to the benchmark value is read out from the reference voltage register and is then decoded so that an actual reference voltage is obtained. Under an ideal condition, the actual reference voltage should equal to the benchmark value.

However, in practice, it is impossible to avoid affection of process and technology during the manufacture process of the chip, and consequently, the actual reference voltage can not completely equal to the benchmark value, and thereby adjustment to the actual reference voltage is needed. For example, the default code pre-configured in the reference voltage register of the chip is 1000_1001 which corresponds to a benchmark value of 1.5V, and however, when the reference voltage register is configured with the default code, the measured actual reference voltage corresponding to the default code (which is 1000_1001) is 1.4V due to the affection of the process and technology.

Further, it is supposed that an encoding step is pre-configured as 0.02V (i.e., each time a binary code increases by one, the corresponding voltage changes by 0.02V), and a deviation value of 0.1V corresponds to five encoding steps. And, it can be seen that the adjustment code should be configured as: 1000_1110, which is obtained by adding 0000_0101 to 1000_1001, in order to obtain an output voltage equal to the benchmark value of 1.5V, where 0000_0101 is the binary code denoting the five encoding steps. And then the adjustment code is burnt into the EFUSE.

Figure 3:
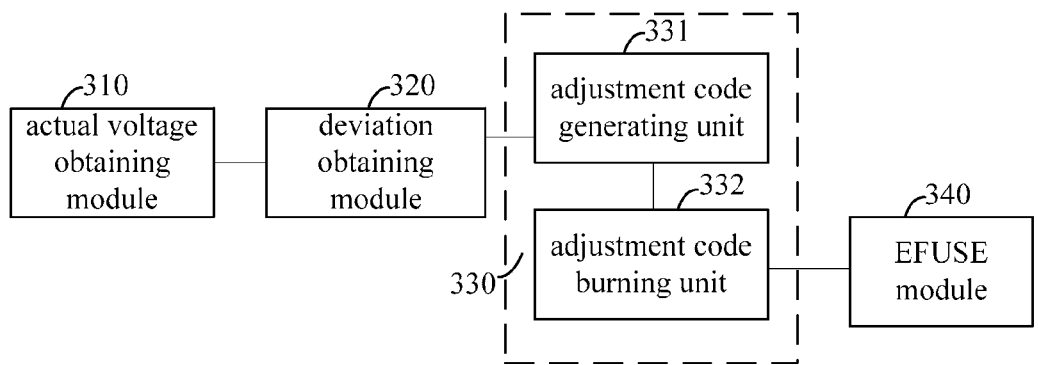
FIG. 3 is a schematic diagram illustrating a structure of an apparatus for adjusting a reference voltage according to an embodiment of the present invention.

An embodiment of the present invention further provides an apparatus for adjusting a reference voltage. As shown in FIG. 3, the apparatus includes: an actual voltage obtaining module 310, a deviation obtaining module 320, an adjustment code generating and burning module 330, and an EFUSE module 340.

The actual voltage obtaining module 310 is adapted to decode a default code configured in a reference voltage register in a chip to obtain an actual reference voltage when the chip is tested on a Wafer Level.

The deviation obtaining module 320 is adapted to compare the actual reference voltage with a benchmark value to obtain a deviation value between the two.

The adjustment code generating and burning module 330 is adapted to configure an adjustment code according to the deviation value and burn the adjustment code into the EFUSE module 340.

The EFUSE module 340 is adapted to store the adjustment code burnt by the adjustment code generating and burning module 330.

The adjustment code generating and burning module 330 includes an adjustment code generating unit 331 and an adjustment code burning unit 332.

The adjustment code generating unit 331 is adapted to configure the adjustment code according to the deviation value.

The adjustment code burning unit 332 is adapted to burn the adjustment code into the EFUSE module 340.

The adjustment code burning unit 332 may be any of chip burning tools in the prior art, e.g., various embedded development boards (e.g., SDK, Software Development Kit) and etc. Technique details will not be described again herein.

As can be seen from the above description, in the method and apparatus for adjusting a reference voltage according to the embodiment of the present invention, the adjustment code is configured according to the deviation value between the benchmark value and the actual reference voltage corresponding to the default code of the chip, and then is burnt into the EFUSE integrated in the chip. Therefore, the external power supply is not needed, and consequently, the reference voltage need not be adjusted in different adjustment manners respectively regarding different application schemes of the external power supply. Thus, adjustment operations on the reference voltage of the chip are standardized and costs of the chip's application schemes are saved.

Figure 4:
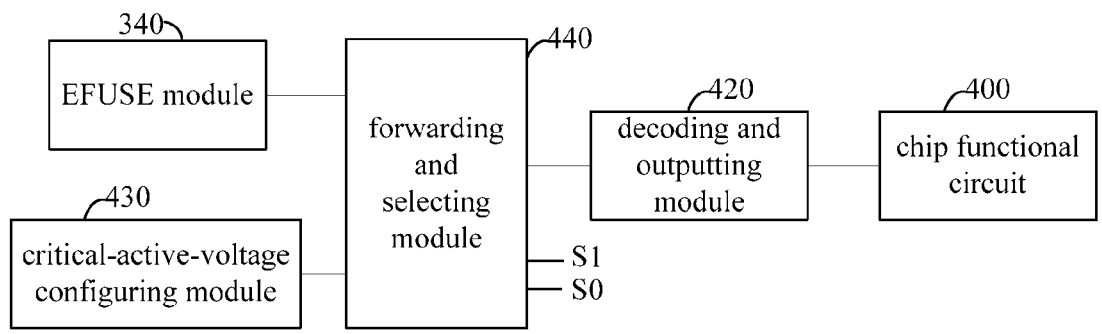
FIG. 4 is a schematic diagram illustrating a structure of an apparatus for obtaining a reference voltage according to an embodiment of the present invention.

According to the above method and apparatus for adjusting a reference voltage, an embodiment of the present invention further provides an apparatus for obtaining a reference voltage. As shown in FIG. 4, the apparatus is configured in a chip and includes: an EFUSE module 340 and a decoding and outputting module 420.

The EFUSE module 340 is adapted to send an adjustment code, that is burned in advance, to the decoding and outputting module 420 when the chip is started.

The decoding and outputting module 420 is adapted to decode the adjustment code sent by the EFUSE module 340 to obtain an actual reference voltage, and output the actual reference voltage to a chip functional circuit 400. At this moment, the actual reference voltage equals to the benchmark value.

It should be noted that, along with changing of the chip's application environment, e.g., when environment temperature, humidity, pressure, electromagnetic interference strength or etc., changes, various working parameters of the chip may change to some extent. To deal with this situation, during the chip's production and packaging, manufacturers are required to test each chip to give a limit range of the reference voltage at which the chip can works normally, so as to make developers and other application manufacturers use the chip reasonably.

Based on the apparatus for obtaining a reference voltage, an embodiment of the present invention may further detect a critical value of the reference voltage for ensuring the chip's normal working. As such, the apparatus for obtaining a reference voltage according to an embodiment of the present invention may further include: a critical-active-voltage configuring module 430, and a forwarding and selecting module 440 may also be included in the apparatus because it is needed to make a selection between the code output from the critical-active-voltage configuring module 430 and that output from the EFUSE module 340.

The forwarding and selecting module 440 is adapted to operate according to a control signal, where, it is adapted to receive the adjustment code sent by the EFUSE module 340 and forward the adjustment code to the decoding and outputting module 420 when the chip is started, and when a critical active voltage of the chip is being tested, it is adapted to receive an active-voltage configuration code configured by the critical-active-voltage configuring module 430 and forward the active-voltage configuration code to the decoding and outputting module 420.

The critical-active-voltage configuring module 430 is adapted to adjust an active-voltage parameter of the chip and send the active-voltage configuration code for adjusting the active-voltage parameter to the forwarding and selecting module 440.

The decoding and outputting module 420 is adapted to decode the adjustment code or the active-voltage configuration code sent by the forwarding and selecting module 440.

It should be noted that, both the EFUSE module 340 and the decoding and outputting module 420 are integrated in the chip, and the critical-active-voltage configuring module 430 and the forwarding and selecting module 440 may be implemented by combining logic circuit resources existing in the chip.

Meanwhile, in practical applications, the critical-active-voltage configuring module 430 may also be configured in the reference voltage register so as to more efficiently utilize storage resources of the register in the chip, i.e., the reference voltage register is adapted to store a pre-configured default code when the chip is tested on a Wafer Level, and to store the active-voltage configuration code when the critical active voltage of the chip is being tested.

Hereinafter, the work principle of the apparatus will be described in detail with reference to a possible specific circuit. As shown in FIG. 4, the critical-active-voltage configuring module 430 in the specific circuit is a reference voltage register, the forwarding and selecting module 440 is a code value selector, and the decoding and outputting module 420 is a reference voltage decoder.

The code value selector decides a decoding source of the reference voltage decoder according to two control signal input ports, S1 and S0, which is shown in Table 1:

TABLE 1

| S1 | S0 | Multiplexed Decoding Source |
|----|-----|------------------------------|
| 1  | N/A | Reference voltage register   |
| 0  | 1   | Reference voltage register   |
| 0  | 0   | EFUSE                        |

As can be seen from configurations shown in Table 1:

A) S1=1;

In this case, the code value selector multiplexes the reference voltage register, and reference voltage decoding is performed according to the active-voltage code read from the reference voltage register, and the value of S0 does not affect the result of the decoding.

B) S1=0;

In this case, the code value selector needs to make a selection further according to the value of S0, where:

a) when S0=1, the active-voltage code of the reference voltage register is multiplexed as the decoding source; and, b) when S0=0, the adjustment code read from the EFUSE is multiplexed as the decoding source.

After the chip is packaged, S1 is fixedly grounded and S0 is set low through a pull-down resistor. As can be seen from Table 1, when input signals from the control signal input ports of the code value selector are both set low, the chip may select to read the adjustment code from the EFUSE after powered-on and then starts. After the chip is powered-on and enters into a stable working state, up/down micro-adjustment to the reference voltage register (i.e., increasing or decreasing the value of the reference voltage register) is further performed, and then the value of S0 is rewritten as 1. At this moment, according to Table 1, what the reference voltage decoder outputs is the output voltage after code adjustment. After the micro-adjustment to the reference voltage register, the critical value of the reference voltage at which the chip works normally can be obtained and the range of the reference voltage at which the chip works normally can thus be determined. The range is one of important parameter indexes in chip applications.

The code value selector in the embodiment of the present invention is only one specific implementation example according to the present invention. There may be many substitute schemes having the same logic functions in the digital circuit. For example, the technical advantages may also be achieved by adopting more input signals, or modifying corresponding relationship between the multiplexed decoding sources and value combinations of S0 and S1, or adopting other multiplex circuits and combination thereof, or etc. Therefore, the description of the technical schemes above shall not be regarded as a limit to the present invention, other circuit modules capable of implementing the same functions shall be included into the protection scope of the present invention.

Figure 5:
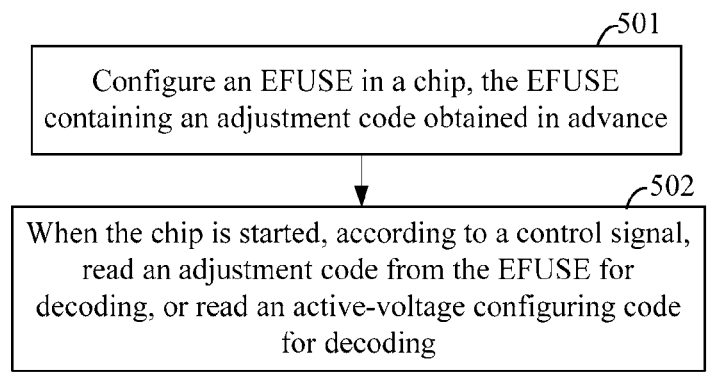
FIG. 5 is a flowchart illustrating a method for obtaining a reference voltage according to an embodiment of the present invention.

An embodiment of the present invention further provides a method for obtaining a reference voltage. As shown in FIG. 5, the method includes:

Step 501: An EFUSE is configured in a chip, the EFUSE containing an adjustment code obtained in advance.

Herein, the adjustment code may be obtained in advance by:

performing a Wafer Level test on the chip and obtaining an actual reference voltage of the chip;

configuring an adjustment code according to a deviation value obtained by comparing the actual reference voltage with a benchmark value, and burning the adjustment code into the EFUSE.

Step 502: When the chip is started, the adjustment code is read from the EFUSE and decoded to obtain an actual reference voltage.

Preferably, Step 502 may alternatively include:

when the chip is started, according to a control signal, reading out the adjustment code from the EFUSE for decoding, or according to a control signal, reading out an active-voltage configuring code for decoding.

As can be seen from the above description, in the apparatus and method for obtaining a reference voltage according to the embodiments of the present invention, the EFUSE is integrated into the chip, each time the chip is started, a reference voltage is obtained by reading out the adjustment code burnt into the EFUSE in advance and decoding it. Therefore, it is not necessary to configure a dedicated pin for reference voltage in the chip to introduce an external reference voltage, which realizes integration of a reference voltage generating function, increases stability of the circuit's working, and lowers the costs of the chip's applications. In addition, according to a preferred embodiment of the present invention, the critical value of the reference voltage at which the chip works normally can be conveniently detect through adjusting the active-voltage code, which is more beneficial to the chip's application in various IC design schemes.

In addition, the EFUSE, as a kind of data carrier, is a specific implementation manner or means adopted by the embodiments of the present invention. It should be noted that, as to the objective of the present invention, the EFUSE is not a unique way to ensure the implementation of the present invention. A One Time Programmable (OTP) memory, which is also a kind of nonvolatile storage medium as the EFUSE, can also realize the same functions as the EFUSE.

Therefore, although the embodiments of the present invention are described by taking the EFUSE as an example, any medium having a storage function and of a nonvolatile character can be used to implement the present invention, and shall be included in the protection scope of the present invention.

What is claimed is:

1. A method for processing a reference voltage in a chip, comprising:
    decoding a default code configured in a reference voltage register in the chip to obtain an actual reference voltage;
    comparing the actual reference voltage with a benchmark value to obtain a deviation value between the two;
    configuring an adjustment code according to the deviation value; and,
    burning the adjustment code into a nonvolatile storage medium.

2. The method of claim 1, wherein the nonvolatile storage medium comprises an Electrically programmable FUSE (EFUSE) or a One Time Programmable (OTP) memory.

3. The method of claim 1, further comprising:
    reading out the adjustment code burned into the nonvolatile storage medium module when the chip is started; and
    decoding the adjustment code to obtain an actual reference voltage.

4. The method of claim 3, wherein the nonvolatile storage medium comprises an Electrically programmable FUSE (EFUSE) or a One Time Programmable (OTP) memory.

5. An apparatus for processing a reference voltage in a chip, comprising:
    an actual voltage obtaining module, adapted to decode a default code configured in a reference voltage register in the chip to obtain an actual reference voltage;
    a deviation comparison module, adapted to compare the actual reference voltage with a benchmark value to obtain a deviation value between the two;
    an adjustment code generating and burning module, adapted to configure an adjustment code according to the deviation value and burn the adjustment code into a nonvolatile storage medium; and,
    the nonvolatile storage medium, adapted to store the adjustment code burned by the adjustment code generating and burning module.

6. The apparatus of claim 5, wherein the adjustment code generating and burning module comprises:
    an adjustment code generating unit and an adjustment code burning unit;
    the adjustment code generating unit being adapted to configure the adjustment code according to the deviation value;
    the adjustment code burning unit being adapted to burn the adjustment code into the nonvolatile storage medium.

7. The apparatus of claim 5, wherein the nonvolatile storage medium comprises an Electrically programmable FUSE (EFUSE) or a One Time Programmable (OTP) memory.

8. The apparatus of claim 5, further comprising:
    a decoding and outputting module,
    wherein the nonvolatile storage medium module is adapted to send the adjustment code when the chip is started, and
    wherein the decoding and outputting module is adapted to decode the adjustment code sent by the nonvolatile storage medium module to obtain an actual reference voltage, and output the obtained actual reference voltage.

9. The apparatus of claim 8, wherein the nonvolatile storage medium comprises an Electrically programmable FUSE (EFUSE) or a One Time Programmable (OTP) memory.

10. The apparatus of claim 5, further comprising:
    a decoding and outputting module;
    a forwarding and selecting module; and
    a critical-active-voltage configuring module,
    wherein the nonvolatile storage medium module is adapted to send the adjustment code when the chip is started,
    wherein the critical-active-voltage configuring module is adapted to adjust an active-voltage parameter of the chip and send an active-voltage configuration code for adjusting the active-voltage parameter to the forwarding and selecting module,
    wherein the forwarding and selecting module is adapted to receive the adjustment code sent by the nonvolatile storage medium module and forward the adjustment code to the decoding and outputting module when the chip is started, and, when a critical active voltage of the chip is being tested, forward an active-voltage configuration code sent by the critical-active-voltage configuring module to the decoding and outputting module, and
    wherein the decoding and outputting module is adapted to decode the adjustment code or the active-voltage configuration code forwarded by the forwarding and selecting module to obtain an output voltage, and output the obtained output voltage.

11. The apparatus of claim 10, wherein the nonvolatile storage medium comprises an Electrically programmable FUSE (EFUSE) or a One Time Programmable (OTP) memory.

12. An apparatus for obtaining a reference voltage in a chip, comprising:
- a nonvolatile storage medium module; and
- a decoding and outputting module,
- wherein the apparatus is adapted to decode a default code configured in a reference voltage register in the chip to obtain an actual reference voltage, compare the actual reference voltage with a benchmark value to obtain a deviation value between the two, configure an adjustment code according to the deviation value and burn the adjustment code into the nonvolatile storage medium module;
- wherein the nonvolatile storage medium module is adapted to send the adjustment code when the chip is started; and,
- wherein the decoding and outputting module is adapted to decode the adjustment code sent by the nonvolatile storage medium module to obtain an actual reference voltage, and output the obtained actual reference voltage.

13. The apparatus of claim 12, further comprising:
- a forwarding and selecting module between the nonvolatile storage medium module and the decoding and outputting module; and
- a critical-active-voltage configuring module adapted to adjust an active-voltage parameter of the chip and send an active-voltage configuration code for adjusting the active-voltage parameter to the forwarding and selecting module;
- wherein the forwarding and selecting module is adapted to receive the adjustment code sent by the nonvolatile storage medium module and forward the adjustment code to the decoding and outputting module when the chip is started, and, when a critical active voltage of the chip is being tested, forward the active-voltage configuration code sent by the critical-active-voltage configuring module to the decoding and outputting module; and
- wherein the decoding and outputting module is adapted to decode the active-voltage configuration code forwarded by the forwarding and selecting module to obtain an output voltage, and output the obtained output voltage.

14. The apparatus of claim 13, wherein the nonvolatile storage medium comprises an Electrically programmable FUSE (EFUSE) or a One Time Programmable (OTP) memory.

15. The apparatus of claim 12, wherein the nonvolatile storage medium comprises an Electrically programmable FUSE (EFUSE) or a One Time Programmable (OTP) memory.

16. A method for obtaining a reference voltage in a chip, comprising:
- decoding a default code configured in a reference voltage register in the chip to obtain an actual reference voltage;
- comparing the actual reference voltage with a benchmark value to obtain a deviation value between the two;
- configuring an adjustment code according to the deviation value;
- burning the adjustment code into a nonvolatile storage medium module; reading out the adjustment code burned into the nonvolatile storage medium module when the chip is started; and
- decoding the adjustment code to obtain an actual reference voltage.

17. The method of claim 16, wherein the nonvolatile storage medium comprises an Electrically programmable FUSE (EFUSE) or a One Time Programmable (OTP) memory.

* * * * *